United States Patent
Franke et al.

(10) Patent No.: US 10,804,045 B2
(45) Date of Patent: Oct. 13, 2020

(54) CONFIGURABLE CIRCUIT-BREAKER

(71) Applicant: Siemens Aktiengesellschaft, Munich (DE)

(72) Inventors: Henry Franke, Berlin (DE); Bernd Schwinn, Fuerth (DE); Michael Strassburger, Ensdorf (DE)

(73) Assignee: SIEMENS AKTIENGESELLSCHAFT, Munich (DE)

( * ) Notice: Subject to any disclaimer, the term of this patent is extended or adjusted under 35 U.S.C. 154(b) by 774 days.

(21) Appl. No.: 15/518,818

(22) PCT Filed: Nov. 26, 2015

(86) PCT No.: PCT/EP2015/077716
§ 371 (c)(1),
(2) Date: Apr. 13, 2017

(87) PCT Pub. No.: WO2016/083486
PCT Pub. Date: Jun. 2, 2016

(65) Prior Publication Data
US 2017/0243702 A1 Aug. 24, 2017

(30) Foreign Application Priority Data

Nov. 26, 2014 (DE) .................. 10 2014 224 173

(51) Int. Cl.
*H01H 9/54* (2006.01)
*H02H 3/00* (2006.01)
(Continued)

(52) U.S. Cl.
CPC ............ *H01H 9/54* (2013.01); *G01R 15/181* (2013.01); *H01H 71/44* (2013.01); *H02H 3/006* (2013.01); *H02H 3/0935* (2013.01)

(58) Field of Classification Search
CPC ........ H01H 9/54; H01H 71/44; H02H 3/0935; H02H 3/006; G01R 15/181
See application file for complete search history.

(56) References Cited

U.S. PATENT DOCUMENTS

| | | | | |
|---|---|---|---|---|
| 4,215,328 A | * | 7/1980 | Chabot | H01H 71/1009 335/170 |
| 4,331,997 A | * | 5/1982 | Engel | H02H 3/006 361/93.2 |

(Continued)

FOREIGN PATENT DOCUMENTS

| | | | | |
|---|---|---|---|---|
| CN | 1278940 A | * | 1/2001 | G01R 31/3272 |
| CN | 1419727 A | | 5/2003 | |

(Continued)

OTHER PUBLICATIONS

International Search Report PCT/ISA/210 for International Application No. PCT/EP2015/077716 dated Apr. 28, 2016.

(Continued)

*Primary Examiner* — Pinping Sun
(74) *Attorney, Agent, or Firm* — Harness, Dickey & Pierce, P.L.C.

(57) ABSTRACT

A circuit breaker is disclosed for interrupting an electrical circuit when current limit values are exceeded. The circuit-breaker includes a current sensor for determining the electrical current flow and a control device. When current limit values are exceeded, the electrical circuit is interrupted. A first current limit value, when exceeded, results in an immediate interruption and a second current limit value, when exceeded, results in a time-delayed interruption, such that the second interruption time reduces as the current increases. Only one control element is included for setting a current limit value. The element defining the second current limit value is included for the time-delayed interruption of the (Continued)

electrical circuit. The other parameters are either set in a fixed manner and/or are related to the settable second current limit value.

18 Claims, 6 Drawing Sheets

(51) Int. Cl.
  *H02H 3/093* (2006.01)
  *G01R 15/18* (2006.01)
  *H01H 71/44* (2006.01)

(56) References Cited

U.S. PATENT DOCUMENTS

| | | | |
|---|---|---|---|
| 4,442,472 A | 4/1984 | Pang et al. | |
| 4,642,724 A * | 2/1987 | Ruta | H02H 3/0935 361/93.4 |
| 4,710,844 A * | 12/1987 | Scott | H02H 3/0935 361/93.2 |
| 5,077,629 A | 12/1991 | Ishii et al. | |
| 5,216,352 A | 6/1993 | Studtmann et al. | |
| 6,055,145 A * | 4/2000 | Lagree | G06J 1/00 361/115 |
| 6,603,649 B1 | 8/2003 | Muller et al. | |
| 7,078,888 B2 * | 7/2006 | Budillon | G01R 15/181 324/127 |
| 7,564,667 B2 * | 7/2009 | Veroni | H02H 3/0935 361/42 |
| 8,907,672 B2 * | 12/2014 | Hori | G01R 33/3852 324/309 |
| 2003/0156374 A1 * | 8/2003 | Edwards | H02H 7/30 361/94 |
| 2009/0195337 A1 * | 8/2009 | Carlino | H01H 71/7463 335/18 |
| 2009/0257156 A1 * | 10/2009 | Vicente | H02H 3/0935 361/42 |
| 2011/0125339 A1 * | 5/2011 | Bright | H02H 7/28 700/293 |
| 2011/0153246 A1 * | 6/2011 | Donaldson | G01R 21/133 702/65 |
| 2013/0221973 A1 * | 8/2013 | Whisenand | G01R 31/005 324/501 |
| 2013/0242441 A1 | 9/2013 | Suthar et al. | |
| 2016/0322805 A1 * | 11/2016 | Franke | H02H 3/0935 |

FOREIGN PATENT DOCUMENTS

| | | | |
|---|---|---|---|
| CN | 201438447 U | 4/2010 | |
| DE | 68918640 T2 | 2/1995 | |
| DE | 69124740 T2 | 9/1997 | |
| DE | 19721591 A1 | 11/1998 | |
| DE | 69326639 T2 | 6/2000 | |
| DE | 102006025607 A1 | 11/2007 | |
| EP | 0279689 A2 * | 8/1988 | H02H 3/0935 |
| EP | 0279689 A2 | 8/1988 | |
| EP | 0 577 339 A1 | 1/1994 | |
| EP | 1082798 B1 | 12/2001 | |
| EP | 2633595 B1 | 12/2017 | |
| WO | WO 2004093283 A1 | 10/2004 | |
| WO | WO2007134767 A2 | 11/2007 | |

OTHER PUBLICATIONS

Written Opinion of the International Searching Authority PCT/ISA/237 for International Application No. PCT/EP2015/077716 dated Apr. 28, 2016.
Chinese Office Action and English translation thereof dated Jun. 20, 201.
German Office Action dated Jun. 30, 2020.

* cited by examiner

CONFIGURABLE CIRCUIT-BREAKER

PRIORITY STATEMENT

This application is the national phase under 35 U.S.C. § 371 of PCT International Application No. PCT/EP2015/077716 which has an International filing date of Nov. 26, 2015, which designated the United States of America and which claims priority to German patent application number DE 10 2014 224 173.1 filed Nov. 26, 2014, the entire contents of which are hereby incorporated herein by reference.

FIELD

An embodiment of the present invention generally relates to a circuit-breaker.

BACKGROUND

Circuit-breakers include compact circuit-breakers or molded-case circuit-breakers, exposed circuit-breakers or air circuit-breakers, line protection breakers or miniature circuit-breakers, earth-leakage circuit-breakers or residual current devices, arc fault breakers or arc fault detection devices, etc.

Circuit-breakers are special switches which are designed, under a wide variety of fault conditions including, for example, ground faults, phase opposition, overcurrent or short-circuit on an electrical network, such as e.g. a low-voltage network, for the switch-in, switch-out and secure interruption of load currents, high overload currents and short-circuit currents. Switching devices of this type are employed as feeder, distribution, coupler and outgoing circuit-breakers in electrical installations. Switches of this type are also used for the switching and protection of motors, capacitors, generators, transformers, busbars and cables.

Circuit-breakers can specifically be employed in low-voltage networks, i.e. networks with voltages or rated voltages of generally up to 1,000 V AC or 1,500 V DC. These circuit-breakers have sensor units, such as current sensors, which measure the electric current flowing in the switch.

Circuit-breakers are designed for different currents. A first characteristic current value of a circuit-breaker is thus the rated current In. This is generally the current which can be applied to the circuit-breaker in a continuous manner. This rated current is device-dependent.

In general, one or more current limit values, which are smaller than, equal to or greater than the rated current In of the circuit-breaker are set as current limit values, the overshoot of which initiates the immediate or time-delayed interruption of the current in the circuit which is protected by the circuit-breaker, i.e. the interruption of the electric current flowing in the circuit-breaker. At the setpoint value, designated hereinafter as a second current limit value Ir, there is no immediate or short-term time-delayed, i.e. no prompt interruption of the electric circuit, but a "long-term time-delayed" interruption, subject to a certain, for example current-dependent delay time, designated hereinafter as the second delay time tr. This means that the current exceeding this second current limit value Ir is carried or sustained by the circuit-breaker for a given time.

If the current in excess of this second current limit value Ir increases, this second delay time or interruption time tr on circuit-breakers generally reduces. This means that a current which achieves or exceeds the second current limit value Ir, during a, for example current-dependent delay time or interruption time tr is not switched-out. Only when this delay time or interruption time tr is exceeded does the interruption of the electric circuit ensue.

If the current achieves a further current limit value, designated hereinafter as the first current limit value Ii, an immediate i.e. prompt interruption of the electric circuit occurs. The associated first delay time or interruption time ti is frequently dependent upon the technical properties of the circuit-breaker, and the shortest technically feasible time for the interruption or switch-out of the circuit-breaker.

Customarily, in circuit-breakers, depending upon their respective application, the first current limit value Ii and the second current limit value Ir must be set as a proportion or a multiple of the rated current In, together with the associated second delay time tr. Alternatively, this setting can also be applied in absolute values.

In this regard, EP 0279689 A2 describes a circuit-breaker having a setting element for the setting of current limit values. By way of the setting element, for example, a current limit value can be set which relates to the long-term time-delayed interruption. The circuit-breaker can also be configured such that a short-term time-delayed protection function is deactivated.

Moreover, DE 68918640 T2 describes a switch with a pre-warning device. The switch comprises a pre-warning evaluation device for the comparison of a first signal from a current value measuring device with a reference value, and for the generation of a second signal, if the first signal lies above the reference value. It is moreover provided that the pre-warning evaluation device has a manually adjustable device for the determination of the reference value from a voltage which is dependent upon the rated current value, a first comparator for the comparison of the first signal with the reference value, a switch which is controlled by the first comparator, and a second comparator, which is connected to the switch for the delivery of the second signal with a time delay, further to the detection by the first comparator to the effect that the first signal exceeds the reference value.

SUMMARY

At least one embodiment of the present invention is directed to an improved circuit-breaker, specifically in respect of the setting of parameters.

According to an embodiment of the invention, a circuit-breaker includes only one setting element for a current limit value. Using this setting element, the magnitude of the second current limit value can be set. Advantageously, setting elements for further current limit values and delay times, which can be fixed and/or determined in relation to the set second current limit value, can be omitted.

BRIEF DESCRIPTION OF THE DRAWINGS

An example embodiment of the present invention is described in greater detail hereinafter with reference to the drawing. Herein.

DETAILED DESCRIPTION OF THE EXAMPLE EMBODIMENTS

Figure 1:
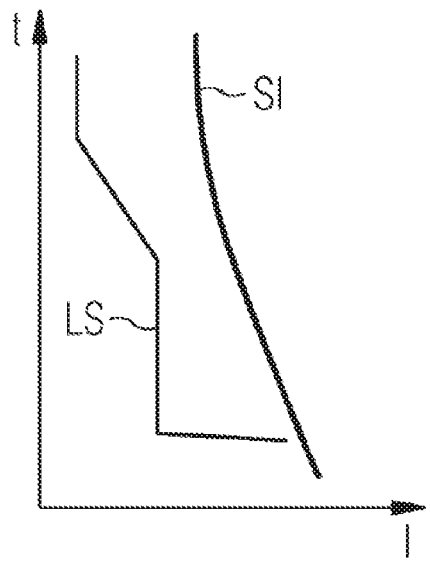
FIG. 1 shows a first current-time characteristic curve of a fuse and a circuit-breaker.

According to an embodiment of the invention, a circuit-breaker includes only one setting element for a current limit value. Using this setting element, the magnitude of the second current limit value can be set. Advantageously, setting elements for further current limit values and delay times, which can be fixed and/or determined in relation to the set second current limit value, can be omitted.

Moreover, the second current limit value Ir is adjustable to between 0.4 and 1 times the rated current In.

This has a specific advantage, in that the rated currents, and thus the dimensions of circuit-breakers can be graduated in a rational manner.

The first current limit value Ii on the circuit-breaker is additionally set to between 8 and 16 times the rated current In. This has a specific advantage in that, by the very rapid switch-out of high fault currents by the circuit-breaker, e.g. short-circuits, very effective protection of the energy distribution system is achieved.

Advantageous configurations of embodiments of the invention are disclosed in the claims.

In an advantageous configuration of an embodiment of the invention, the control device is configured such that, upon the overshoot of the second current limit value Ir, the second delay time or interruption time tr reduces in an at least partially proportional manner to the inverse fourth power of the current ($I^{-4}$). This has a specific advantage, in that a characteristic curve gradient is achieved which approximates the characteristic of customary (low-voltage) fuses. The circuit-breaker thus effectively integrates in a combination of up-circuit and/or down-circuit fuses in a circuit, wherein the effective graduation of the current limit values of fuse and circuit-breaker can be achieved, with no intersection of the characteristic curves of protective elements (fuse, circuit-breaker) to a more than necessary degree.

In an embodiment of the invention, the control device is configured such that, upon the overshoot of the second current limit value Ir, the second delay time or interruption time tr reduces in an at least partially proportional manner to the inverse fourth power of the current ($I^{-4}$) until the first current limit value Ii is achieved, which initiates a prompt interruption, for example with a first interruption time ti. This has a specific advantage, in that the behavior of the circuit-breaker is improved. Moreover, the behavior of the circuit-breaker is more effectively matched to a fuse/circuit-breaker combination.

In an advantageous configuration of an embodiment of the invention, the control device is configured such that the temporal interruption behavior of the circuit-breaker at currents I between the second current limit value Ir and the first current limit value Ii, at least in stages, is proportional to the inverse fourth power of the current ($I^{-4}$), wherein this characteristic curve for the inverse fourth power ($I^{-4}$) is determined by a reference current value Iref and a reference interruption time or reference delay time tref. This means that the position of the characteristic curve is given by a reference current value and a reference interruption time or reference delay time, wherein the characteristic curve gradient is determined by the inverse fourth power of the current. This has a specific advantage, in that the position of the curve is clearly defined.

In an advantageous configuration of an embodiment of the invention, the control device is configured such that the reference current value (Iref) is greater than the second current limit value (Ir). This has a specific advantage, in that the position of the characteristic curve is defined by a reference current value which lies within the working range of the breaker.

In an advantageous configuration of an embodiment of the invention, the control device is configured such that the reference current value (Iref) is equal to 1.5 times, 6 times, or between 1.1 and 3 times, 3 and 9 times, or 1.1 and 9 times the second current limit value (Ir).

This has a specific advantage, in that the position of the characteristic curve is given by a reference current value which lies in an advantageous region of the characteristic curve and, for example, is located in the region of the second current limit value Ir or in the start-up region of the characteristic curve.

In an advantageous configuration of an embodiment of the invention, the control device is configured such the reference interruption time (tref) lies within the range of 500 to 2,000 seconds, specifically at a value of 600, 1,000, 1,300 or 1,500 seconds. This has a specific advantage, in that a long-term time delay is dictated, with a simultaneously service life-optimized loading of the circuit-breaker.

In an advantageous configuration of an embodiment of the invention, the current sensor is a Rogowski coil. This has a specific advantage, in that a high accuracy of current measurement is achieved.

In an advantageous configuration of an embodiment of the invention, the control device has a series circuit comprised of a low-pass filter, an analog-digital converter and a microcontroller. This has a specific advantage, in that a particularly simple method of construction is possible.

In an advantageous configuration of an embodiment of the invention, the microcontroller is configured such that a squared value of the measured current values ($I^2$) is determined, which is compared with the squared current limit values ($Ir^2$, $Ii^2$), in the event of the overshoot of the squared second current limit value ($Ir^2$) a further squaring of the squared measured current value ($I^4$) is applied, the fourth power of the current value is totalized over time, this time-totalized current value is compared with the fourth power of the corresponding characteristic curve current value and, in the event of an overshoot, an interruption of the electrical circuit ensues.

This has a specific advantage, in that the interruption procedure can easily be incorporated into the firmware of a microcontroller.

In energy distribution, circuit-breakers are not only employed in isolation, but in combination with up-circuit or down-circuit fuses.

Fuses per se provide both overload and short-circuit protection, in the same way as a circuit-breaker, but with the distinction that a current limit value cannot be set on fuses. A fundamental problem in this combined form is that, typically, the current-time characteristic curves of the protection function of a circuit-breaker and a fuse are significantly different.

FIG. 1 shows a diagram with current I on the X-axis and time t on the Y-axis. Both the X- and Y-axes are logarithmic.

Two characteristic curves are plotted in the diagram, one for a fuse SI and the other for a circuit-breaker LS.

The objective in the selection and setting of protective devices or protective elements, such as fuses and circuit-breakers, is the selective graduation of fuses and circuit-breakers in relation to the current to be interrupted, such that only the closest up-circuit protective element to the fault is tripped in each case.

Accordingly, the current-time characteristic curves, inclusive of structurally-dictated tolerances, should not intersect.

Figure 2:
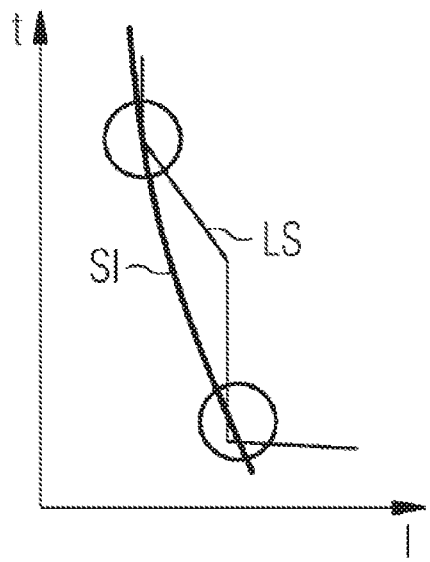
FIG. 2 shows a second current-time characteristic curve of a fuse and a circuit-breaker.

FIG. 2 shows a diagram according to FIG. 1, with the distinction that the characteristic curve of an up-circuit or load-side fuse of an unrepresented load intersects with that of a down-circuit or current source-side circuit breaker at two points. The intersections are respectively marked with circles.

Figure 3:
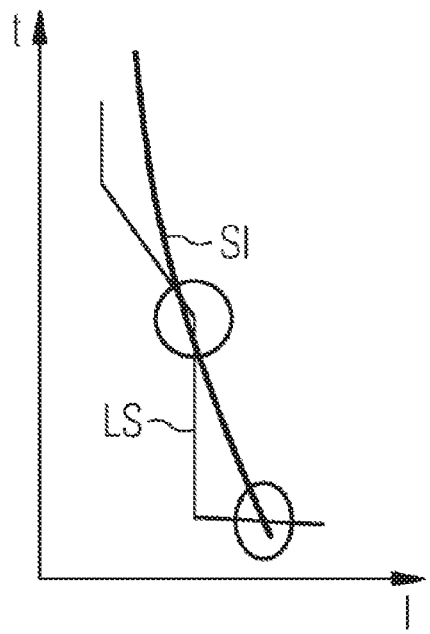
FIG. 3 shows a third current-time characteristic curve of a fuse and a circuit-breaker.

FIG. 3 shows a diagram according to FIG. 1, with the distinction that the characteristic curve of an up-circuit or load-side circuit-breaker of an unrepresented load intersects with that of a down-circuit or current source-side fuse at two points. The intersections are respectively marked with circles.

At points of intersection, a problem can arise, in that the respective source-side protective element is tripped rather than the load-side protective element. Both protective elements might also be tripped simultaneously.

Figure 4:
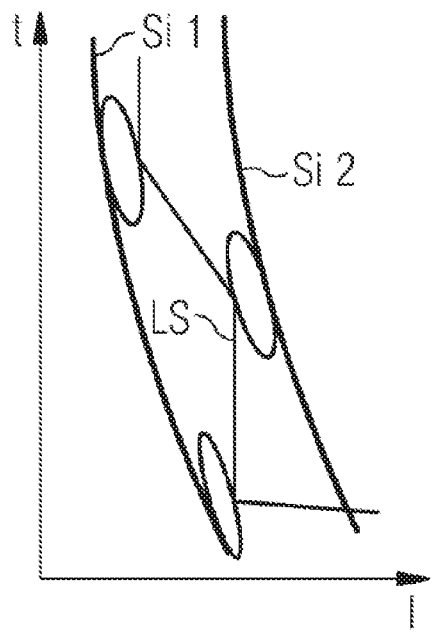
FIG. 4 shows a fourth current-time characteristic curve of a fuse and a circuit-breaker.

This problem can be resolved, wherein the participating protective elements are designed with sufficiently large current margins or trip current margins, such that the time-current characteristic curves of the protective elements do not intersect. FIG. 4 shows a diagram according to the preceding figures, with the distinction that the time-current characteristic curves of the fuse Si1, the fuse Si2 and the circuit-breaker LS do not intersect, as indicated by ellipses.

In order to minimize current margins insofar as possible, numerous parameters can be set on circuit-breakers or the electronic trip units thereof, or ETUs for short.

Figure 5:
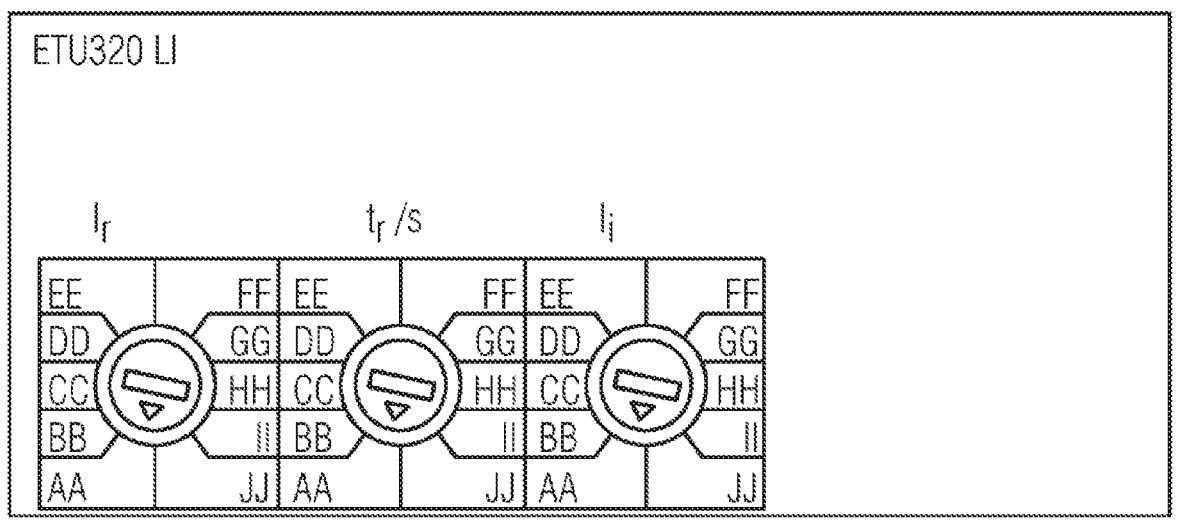
FIG. 5 shows setting elements of a circuit-breaker.

FIG. 5 shows setting elements for a circuit-breaker, by which a second current limit value Ir, a second delay time tr and a first current limit value Ii can be set.

Figure 6:
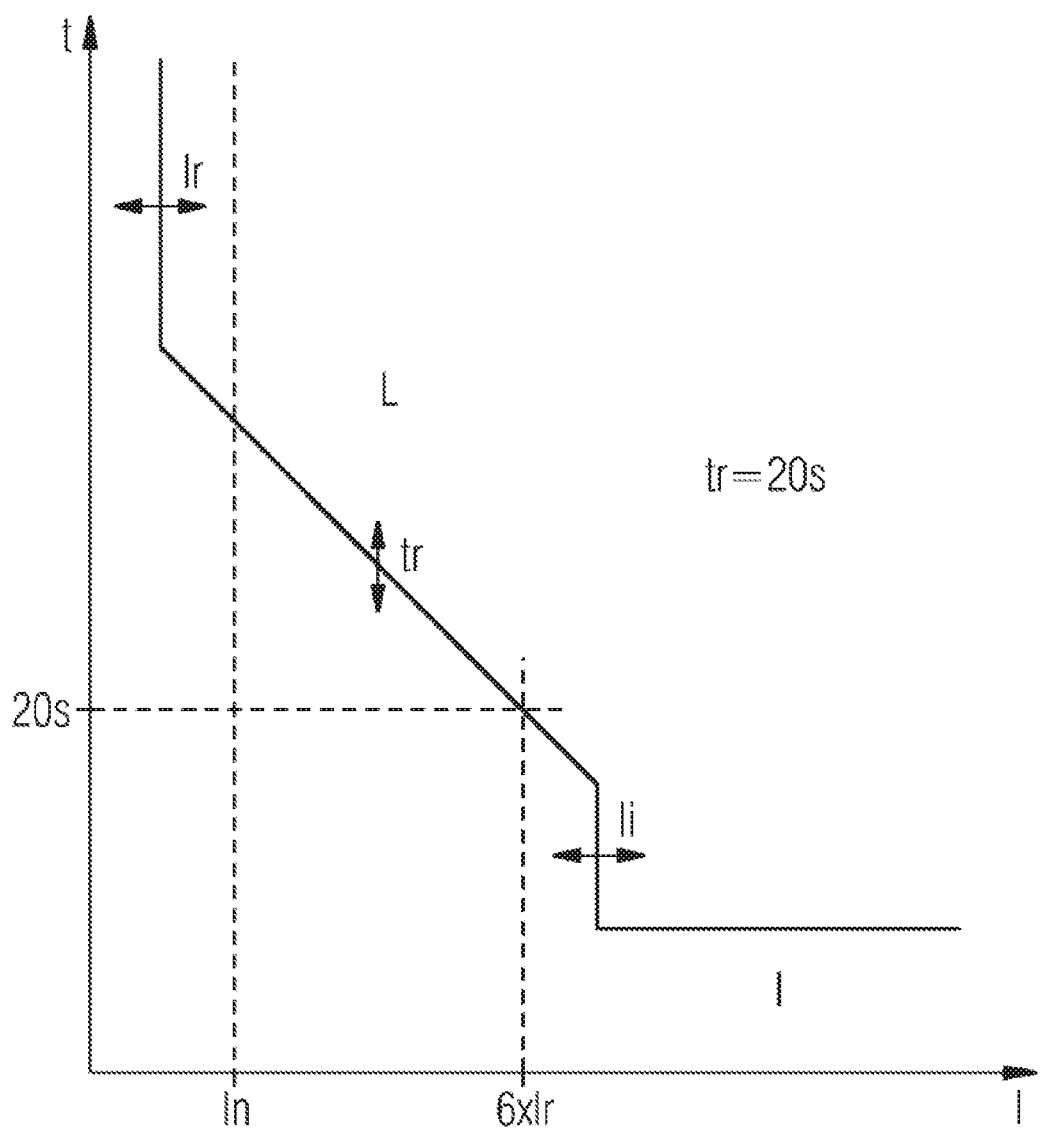
FIG. 6 shows a detailed current-time characteristic curve of a circuit-breaker.

FIG. 6 shows a current-time diagram of the aforementioned type, for the clarification of parameters. Herein, as in the previous diagrams, the values on the X- and Y-axes are logarithmic. This means that both the current I and time t are represented logarithmically.

The rated current In of the circuit-breaker is plotted as one curve. Starting from the zero point on the X-axis, a second current limit value Ir is firstly achieved, at which the circuit-breaker, with a "long-term time delay", to which a long-term time-delayed second interruption time tr is assigned, is switched-out or tripped. If the current increases, this second interruption time or delay time tr reduces until, at a first current limit value Ii, the circuit-breaker interrupts or trips the current. In general, this interruption thus occurs without delay, or with a first interruption time or delay time ti which, depending upon the current-side initiation of the characteristic curve, may be subject to slight variation.

As a maximum, the second current limit value Ir can be equal to the rated current In of the circuit-breaker; however, the second current limit value Ir can also be set to a lower current limit value than the rated current In.

In many cases, the setting of the parameters Ir, tr and Ii, for example in a plotted LI characteristic curve (overload and short-circuit protection) is confusing for many users of circuit-breakers, as the accurate definition of these parameters is frequently unfamiliar.

In the use of an LSI characteristic curve (overload, short-term time-delayed short-circuit and immediate short-circuit protection), further parameters, such as a third current limit value Isd for short-term time-delayed short-circuit protection, a third delay time tsd for short-term time-delayed short-circuit protection, and a characteristic curve $I^2sd$ for short-term time-delayed short-circuit protection, are usually additionally considered in the characteristic curve, further handicapping the achievement of a setting with optimized selectivity.

By the setting of these parameters, the position of the characteristic curve of the circuit-breaker is determined. Incorrect setting may result in intersections with the characteristic curves of up-circuit and down-circuit protective devices, such as fuses and/or circuit-breakers.

According to an embodiment of the invention, it is provided that only a single current limit value can be set on the circuit-breaker. According to the invention, this is the second current limit value Ir.

The other parameters are either set in a fixed manner and/or are related to the settable or set second current limit value Ir.

According to an embodiment of the invention, the second current limit value Ir can be set between 0.4 and 1 times the value of the rated current In. A somewhat larger range, commencing at 0.3, or a somewhat smaller range, commencing at 0.5 or 0.6, would also be possible, wherein any intermediate value is also possible.

The first current limit value Ii is set to between 8 and 16 times the rated current, for example at a multiple of 9, 10, 11, 12, 14 or 15 thereof, wherein intermediate values are also possible. The first current limit value Ii can, for example, be set in a fixed manner.

The characteristic curve which gives the second delay time or interruption time tr in relation to current, between the second current limit value Ir and the first current limit value Ii, is at least partially proportional to the inverse fourth power $I^{-4}$ of the current. Alternatively, another gradient can be selected for the characteristic curve, for example the third $I^{-3}$, fifth $I^{-5}$, sixth $I^{-6}$, seventh $I^{-7}$, eighth $I^{-8}$ or second $I^{-2}$ power of the current.

The position of this characteristic curve is dictated by the gradient and a reference point on said characteristic curve, wherein the reference point is determined by a reference current value Iref and a reference interruption time tref.

According to an embodiment of the invention, the reference current value Iref is equal to 1.5 times or 6 times the set second current limit value Ir. However, it can also assume another value, for example between 1.1 or 1.3 to 3 times said value, or up to 6, 8 or 9 times said value. A multiple of 6 times this value is also advantageous. In FIG. 6, for exemplary purposes, the reference current value Iref is represented as 6 times the value of the second current limit value Ir. An exemplary reference interruption time tref of 20 s is assigned hereto, as represented in FIG. 6.

According to an embodiment of the invention, the delay time assigned to the reference point or the reference interruption time tref lies within the range of 500 to 2,000 seconds and, for example, is adjustable, such that it can assume values of 600, 1,000, 1,300 or 1,500 seconds, or any other value.

Figure 7:
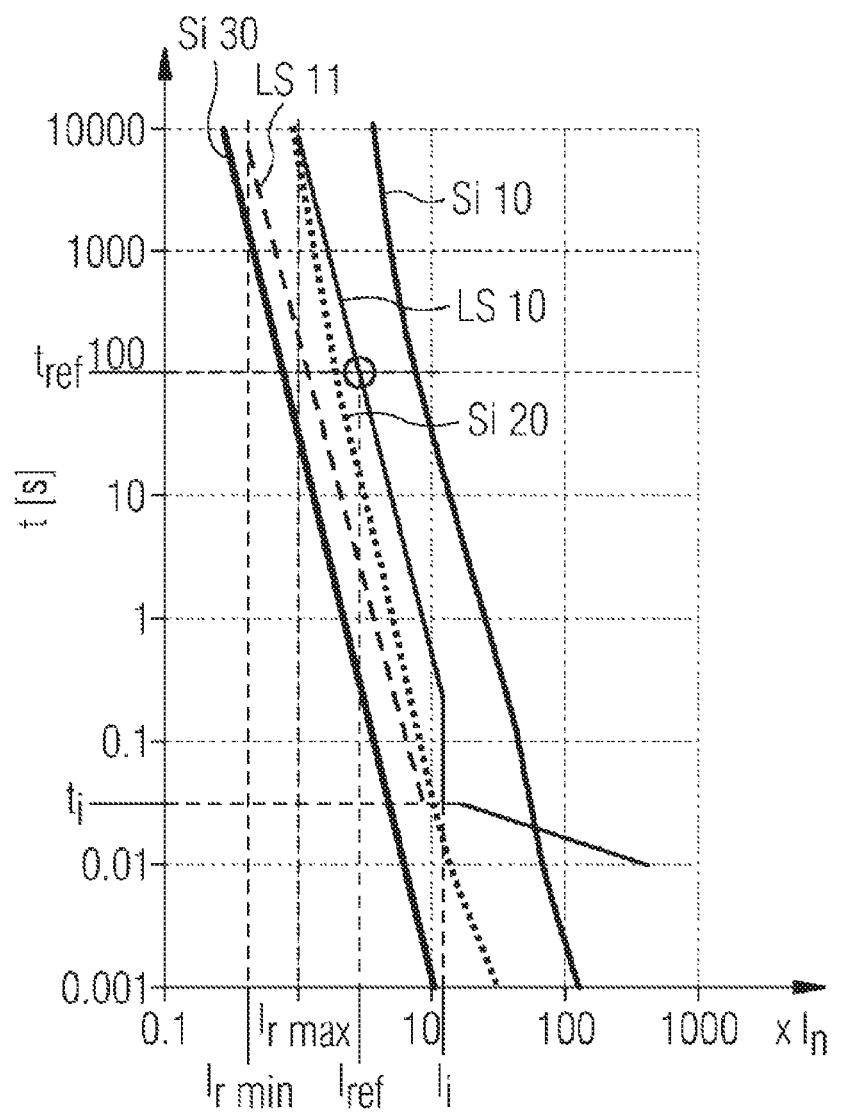
FIG. 7 shows a fifth current-time characteristic curve of two fuses and a circuit-breaker.

FIG. 7 represents a diagram according to the preceding figures, with a plurality of characteristic curves, a fuse characteristic curve Si10, corresponding to a fuse with a current rating of 630 A, a fuse characteristic curve Si20, corresponding to a fuse with a current rating of 250 A, a fuse characteristic curve Si30, corresponding to a fuse with a current rating of 100 A, and two characteristic curves LS10, LS11 for a circuit-breaker having different set second current limit values Ir, firstly the characteristic curve LS10 with a second current limit value Ir of 400 A, which is equal to the rated current In of the circuit-breaker (In=400 A), and secondly the characteristic curve LS11 with a second current limit value Ir of 160 A, which corresponds to 0.4 times the rated current In of the circuit-breaker (In=400 A). As can be seen from FIG. 7, the characteristic curves intersect only in the region of the first rated current Ii, where there is no other technical possibility, but not in other regions of the characteristic curve. The graduation of fuses with circuit-breakers according to the invention in a circuit, for example a (low-voltage) energy distribution network is thus possible with the maximum assurance of selectivity, i.e. wherein the protective element which is closest to the fault interrupts or trips the circuit. This means that the fuse with the lower current rating interrupts the circuit in the event of a fault (overload current, short-circuit, etc.).

According to an embodiment of the invention, by the variation of the second current limit value Ir, the adjustment of a circuit-breaker to at least one of a subordinate LS10 with a superimposed Si10,
a superimposed LS10 with a subordinate Si20,
a subordinate LS11 with a superimposed Si20,
a superimposed LS11 with a subordinate Si30, and
can be achieved in a simple manner by changing the second current limit value Ir.

Figure 8:
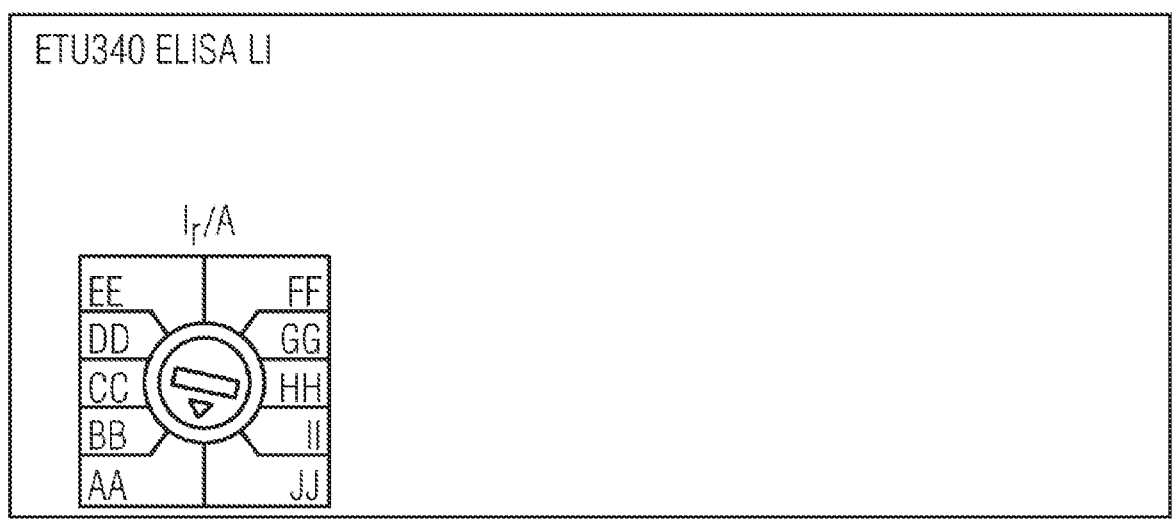
FIG. 8 shows a setting element of a circuit-breaker.

FIG. 8 shows a setting element of a circuit-breaker, in which only one current limit value, the second current limit value Ir, can be set. The magnitude of the current limit value to be set or the current pull-in value is represented by the letters AA, BB, CC, etc.

Figure 9:
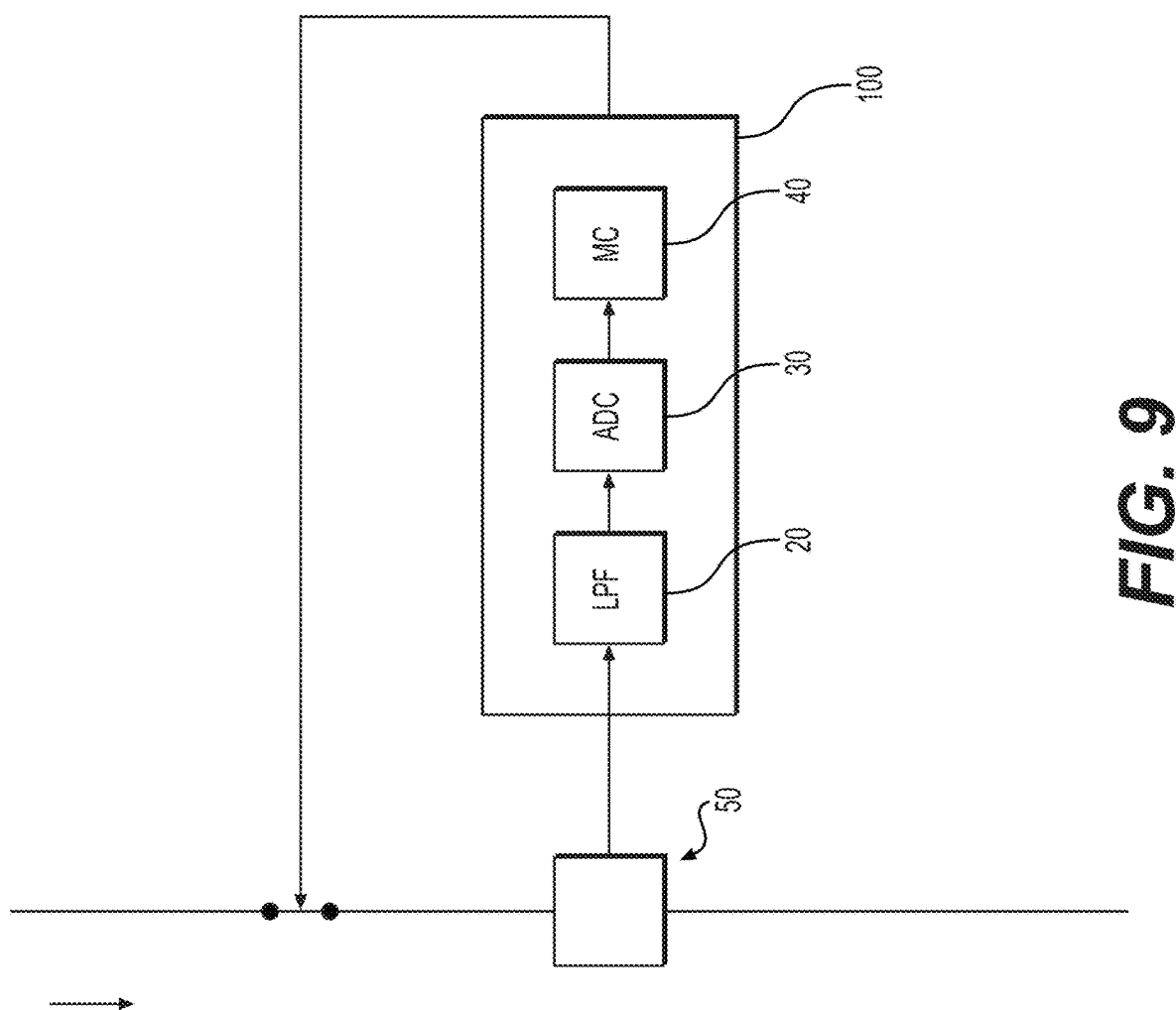
FIG. 9 shows the control device of the circuit breaker including a series circuit comprised of a low-pass filter, an analog-digital converter and a microcontroller.

FIG. 9 shows the control device 100 of the circuit breaker including a series circuit 10 comprised of a low-pass filter 20, an analog-digital converter 30 and a microcontroller 40.

According to an embodiment of the invention, the circuit-breaker has a current sensor 50 or current converter for measuring the current flowing in the circuit-breaker of the electrical circuit to be protected. The measured current value or its equivalent is routed to a control device 100.

This incorporates the low-pass filter 20 for frequency limitation, and moreover the analog-digital converter 30 and the microcontroller 40.

The microcontroller 40 can be configured for the squaring of the measured current values ($I^2$) and the comparison thereof with the squared current limit values ($Ir^2$, $Ii^2$). Upon the overshoot of the squared second current limit value ($Ir^2$), a further squaring of the squared measured current value ($I^4$) is executed. This fourth power of the current value is totalized over time and is compared, e.g. in time blocks, with the fourth power of the corresponding characteristic current value. In the event of an overshoot of this value, the electrical circuit is interrupted. This sequence can be executed in the firmware of the microcontroller 40.

The control device 100 can be configured in a specifically more advantageous manner as an electronic control device, for example as an electronic trip unit. The use of electronic components permits the exceptionally simple and effective execution of an embodiment of the invention.

An embodiment of the invention is further clarified in other terms hereinafter.

By the determination of the characteristic of a reference point on the long-term time-delayed trip characteristic curve of a circuit-breaker according to size, and the fixed definition of the transition from the long-term time delay to the short-term time delay, the number of settable parameters is reduced from at least 3 (customarily 5 or more) to 1. This permits the user to effect the much simpler adjustment and adaptation of the characteristic curve of the circuit-breaker to the fuse trip characteristic curve.

By the client-side input of a current reference point Iref and a time tref, these values have a major influence upon the position of the characteristic curve, and accordingly are extremely relevant to the desired selectivity of up-circuit or down-circuit fuses.

In the solution according to an embodiment of the invention, the characteristic curve is only adjustable by way of the parameter Ir.

An embodiment of the invention involves a current-time characteristic curve which is no longer expressed and set by parameters for overload (L), short-term time-delayed short-circuit (S) or immediate short-circuit (I) protection, but solely and exclusively by the parameter of the second current limit value Ir, which represents the overload.

All other parameters are given by the predetermined or circuit-breaker-dependent current-time characteristic curve, which approximates or is modeled on a fuse.

This delivers the advantage of a narrower band for the rated current graduation of protective elements or protective devices, and thus a cost saving, as components of smaller size can be selected.

The invention claimed is:

1. A circuit-breaker for interrupting an electrical circuit upon an overshoot of current limit values, comprising:
    a control device to, upon the overshoot of the current limit values, interrupt the electrical circuit;
    a current sensor to determine electric current flowing in the circuit-breaker, the current sensor being connected to the control device of the circuit-breaker, the control device being configured to interrupt the electrical circuit with a rated current on the circuit-breaker with a first current limit value, being a multiple of the rated current the overshoot of which initiates a prompt interruption, and with a second current limit value, relatively smaller than or equal to the rated current, the overshoot of which initiates a long-term time-delayed interruption, such that the second interruption time relatively reduces as the current relatively increases; and
    only one actuating element to set a current limit value, which determines the second current limit value for the long-term time-delayed interruption of the electrical circuit, further current limit values and delay times being at least one of set in a fixed manner and determined in relation to the set second current limit value, the second current limit value being settable to between 0.4 and 1 times the rated current and
the first current limit value on the circuit-breaker being set to between 8 and 16 times the rated current value,
    wherein the control device is configured such that, upon the overshoot of the second current limit value, the second interruption time relatively reduces in an at least partially proportional manner to an inverse fourth power of the current,
    wherein the control device includes a series circuit comprised of a low-pass filter, an analog-digital converter and a microcontroller,
    wherein the microcontroller is configured such that a squared value of a measured current value is determined, the squared value of the measurement current being compared with a squared current limit value, and
    wherein in an event upon the squared value of the current value overshooting the squared second current limit value, a further squaring of the squared value of the measured current value is applied, the fourth power of the measured current value being totalized over time, the time-totalized fourth power of the measured current value being compared with a fourth power of a corresponding characteristic curve current value and, in an event of the time-totalized fourth power of the measured current value overshooting the fourth power of the corresponding characteristic curve current value, an interruption of the electrical circuit ensuing.

2. The circuit-breaker of claim 1, wherein the control device is configured such that, upon the overshoot of the second current limit value, the second interruption time relatively reduces in an at least partially proportional manner to the inverse fourth power of the current until the first current limit value is achieved, which initiates a prompt interruption, with a first interruption time.

3. The circuit-breaker of claim 2, wherein the control device is configured such that a temporal interruption behavior of the circuit-breaker at currents between the second current limit value and the first current limit value, at least in stages, is proportional to the inverse fourth power of the current, and wherein a characteristic curve for the inverse fourth power is determined by a reference current value and a reference interruption time.

4. The circuit-breaker of claim 3, wherein the control device is configured such that the reference current value is relatively greater than the second current limit value.

5. The circuit-breaker of claim 4, wherein the control device is configured such that the reference current value is equal to a value between 1.1 and 1.9 times the second current limit value.

6. The circuit-breaker of claim 4, wherein the control device is configured such that the reference interruption time lies within a range of 500 to 2,000 seconds.

7. The circuit-breaker of claim 3, wherein the control device is configured such that the reference interruption time lies at a value of 600, 1,000, 1,300 or 1,500 seconds.

8. The circuit-breaker of claim 2, wherein the current sensor is a Rogowski coil.

9. The circuit-breaker of claim 1, wherein the control device is configured such that a temporal interruption behavior of the circuit-breaker at currents between the second current limit value and the first current limit value, at least in stages, is proportional to the inverse fourth power of the current, and wherein a characteristic curve for the inverse fourth power is determined by a reference current value and a reference interruption time.

10. The circuit-breaker of claim 9, wherein the control device is configured such that the reference current value is relatively greater than the second current limit value.

11. The circuit-breaker of claim 10, wherein the control device is configured such that the reference current value is equal to a value between 1.1 and 1.9 times the second current limit value.

12. The circuit-breaker of claim 10, wherein the control device is a configured such that the reference interruption time lies within a range of 500 to 2,000 seconds.

13. The circuit-breaker of claim 12, wherein the control device is configured such that the reference interruption time lies at a value of 600, 1,000, 1,300 or 1,500 seconds.

14. The circuit-breaker of claim 9, wherein the control device is configured such that the reference current value is equal to a value between 1.1 and 1.9 times the second current limit value.

15. The circuit-breaker of claim 9, wherein the control device is configured such that the reference interruption time lies within a range of 500 to 2,000 seconds.

16. The circuit-breaker of claim 15, wherein the control device is configured such that the reference interruption time lies at a value of 600, 1,100, 1,300 or 1,500 seconds.

17. The circuit-breaker of claim 9, wherein the current sensor is a Rogowski coil.

18. The circuit-breaker of claim 1, wherein the current sensor is a Rogowski coil.

* * * * *